United States Patent [19]

Rauch

[11] Patent Number: 4,477,557
[45] Date of Patent: Oct. 16, 1984

[54] STENCIL MAKING AND UTILIZATION METHODS, APPARATUS AND ARTICLES

[76] Inventor: Georg Rauch, Apartado #33, Jocotepec, Jalisco, Mexico

[21] Appl. No.: 324,733

[22] Filed: Nov. 25, 1981

[51] Int. Cl.³ .............................................. G03F 7/12
[52] U.S. Cl. .................................. 430/308; 430/327; 430/270; 427/54.1; 427/143; 427/243
[58] Field of Search ............... 430/308, 270, 170, 169, 430/327; 427/54.1, 143, 243

[56] References Cited

U.S. PATENT DOCUMENTS

| 457,712 | 8/1891 | Hamburger | 430/270 X |
| 2,557,352 | 6/1951 | Kanitz | 101/128.2 |
| 3,246,986 | 4/1966 | Borchers | 430/170 |

Primary Examiner—John E. Kittle
Assistant Examiner—José G. Dees
Attorney, Agent, or Firm—Benoit Law Corporation

[57] ABSTRACT

Stencils of a desired design are made by selective hardening of first and second individually soluble substances being hardenable in admixture in a foraminous stencil blank, which is initially impregnated with the first substance. The second substance is stored separately from such impregnated stencil blank, such as in a pen. This separately stored second substance is thereafter selectively applied in the form of the desired design to the impregnated stencil blank for admixture with the first substance only immediately prior to a desired selective hardening of the admixed first and second substances, to render part of the stencil imperforate. A stencil is also exposed to dissolution of any applied first and second substances outside of the latter part, for rendering the stencil perforate outside of that part.

15 Claims, 27 Drawing Figures

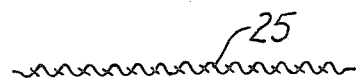
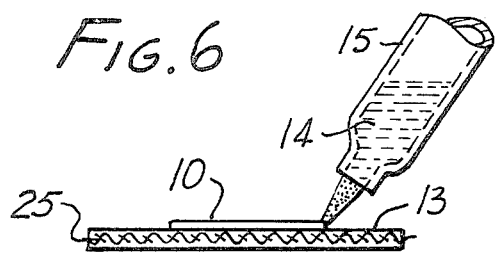
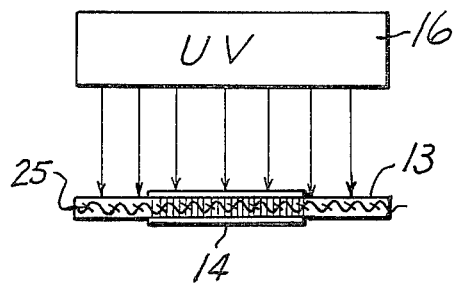
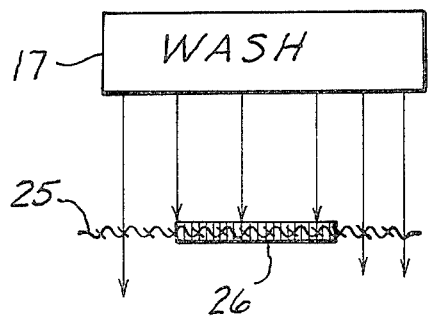
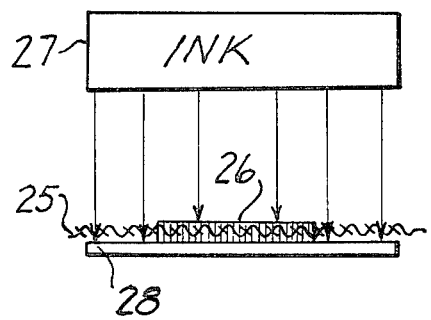
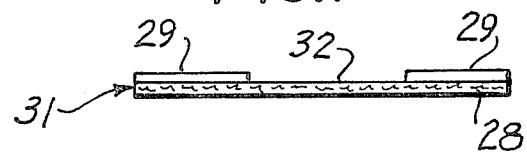

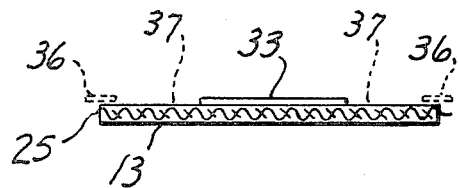
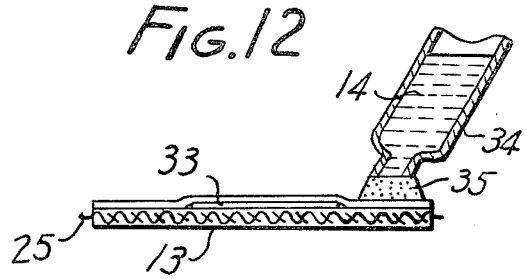
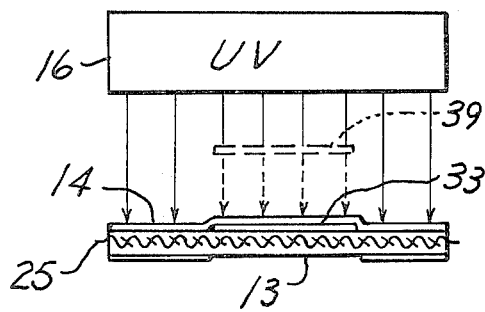
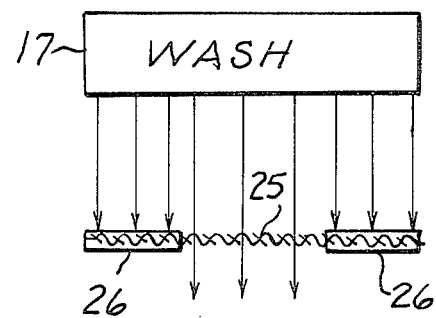
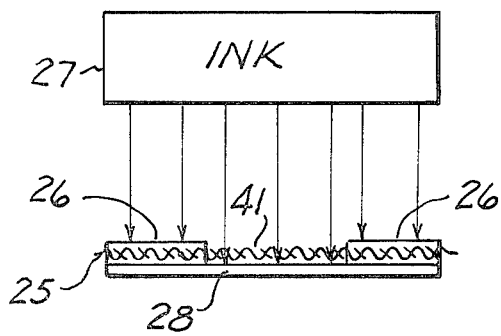
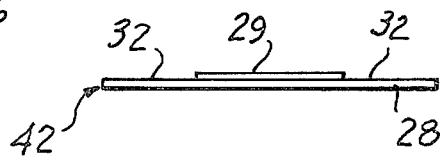

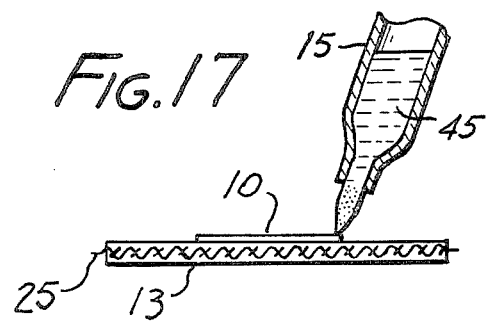
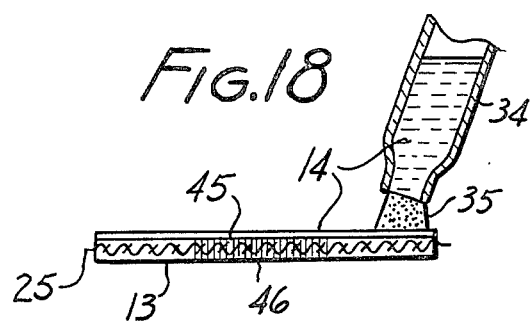
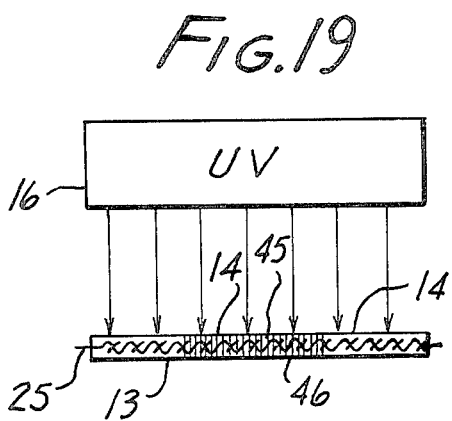
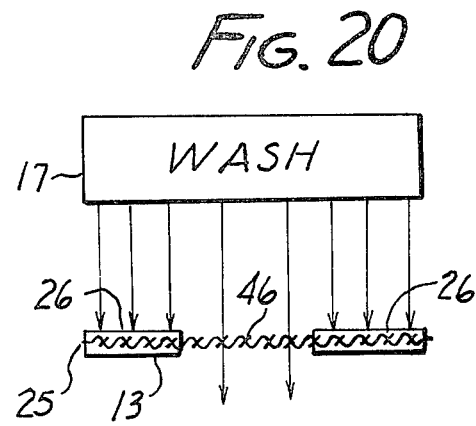
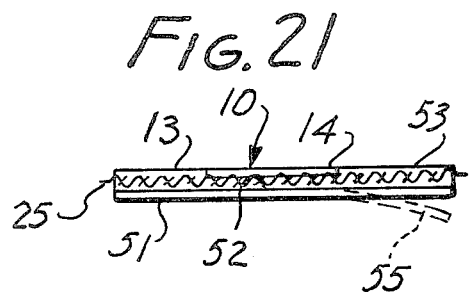
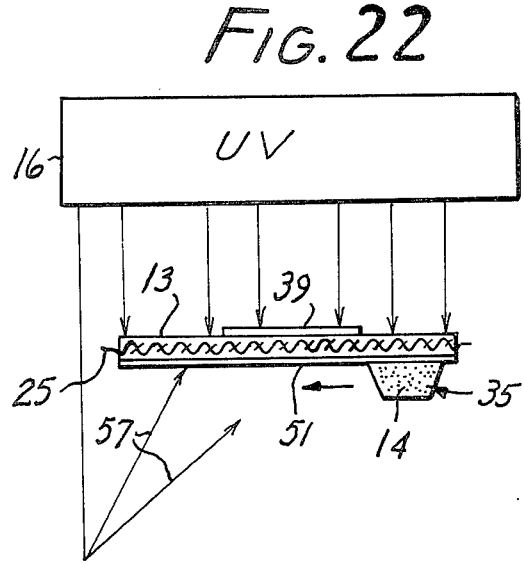

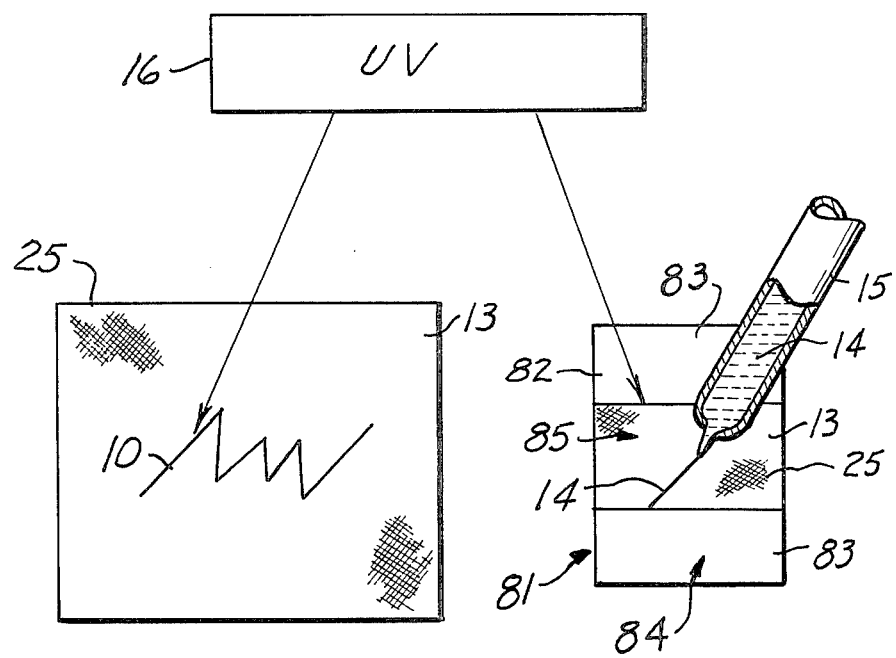

STENCIL MAKING AND UTILIZATION METHODS, APPARATUS AND ARTICLES

BACKGROUND OF THE INVENTION

1. Field of the Invention

The subject invention relates to stencil making and utilization methods, apparatus and articles, to stencils and to screen printing and stenciling.

2. Disclosure Statement

The following disclosure statement is made pursuant to the duty of disclosure imposed by law and formulated in 37 CFR 1.56(a). No representation is hereby made that information thus disclosed in fact constitutes prior art, inasmuch as 37 CFR 1.56(a) relies on a materiality concept which depends on uncertain and inevitably subjective elements of substantial likelihood and reasonableness, and inasmuch as a growing attitude appears to require citation of material which might lead to a discovery of pertinent material though not necessarily being of itself pertinent. Also, the following comments contain conclusions and observations which have only been drawn or become apparent after conception of the subject invention or which contrast the subject invention or its merits against the background of developments which may be subsequent in time or priority.

A simple form of stencil comprises a thin sheet of paper, metal or another material, which is perforated or cut through in such a way that an application of ink, paint or another suitable substance to the stencil will producepatterns, designs or lettering corresponding to the perforation or cutout on a surface beneath the applied stencil.

The making of stencils requires special tools and skills which are generally beyond the reach of broad segments of the population and which, by their very nature, typically inhibit an expression of individual creativity on the part of the user. The same applies to other quality methods and devices for producing patterns, designs and letters by artisans, children and hobbyists or by others in relatively small series.

A special stencil printing method is known as silk screen printing or serigraphy, which is an ancient art, involving the printing of patterns, designs and lettering through a piece of silk or other fine cloth in which selected areas have been stopped out by an impermeable film.

Considerable progress has been realized in this art with the availability and use of photosensitive emulsions for selectively stopping areas of the screen upon photographic exposure and development. A further important step in the direction of a more general use of this enjoyable meaningful and useful art came about with the provision and availability of direct photo emulsions, typically of the diazo type, where the photographic development upon exposure is conveniently reduced for the user to a washout under subdued light, whereby the emulsion will be removed from non-stopped areas of the screen. For raised image printing plates, a special nylon screen has been sensitized with a dichromate.

My prior U.S. Pat. No. 4,142,464, issued Mar. 6, 1979 and herewith incorporated by reference herein, went a long way of relieving the state of the art of its makeshift nature at the amateur and user level, especially in the area or providing the desired image pattern and preparing the stencil by photographic methods.

A persistent problem with the use of photo emulsions is the light and temperature sensitivity and the naturally limited shelf life of the sensitized emulsions, requiring operation under darkroom conditions or with opaque packages and frequently necessitating refrigerated storage.

Even if manufacturers and users are willing and able to put up with these problems, they still are practically relegated to operation with clear film material to which the pattern, design or lettering to be printed has to be applied beforehand. While there are applications in which the latter procedure is still useful, artistic expression and ease of operation are impeded in many other areas.

There also has been a need for methods, apparatus and articles for producing durable and appealing designs and ornamentations on ceramics and various other objects without use of a kiln or other complex equipment.

There further has been a need for repairing and joining articles in a novel and durable manner.

SUMMARY OF THE INVENTION

It is a general object of this invention to overcome the disadvantages and meet the needs expressed or implicit in the above disclosure statement or in other parts hereof.

It is a germane object of this invention to provide improved stencil making methods, apparatus and articles which avoid the above mentioned drawback and meet the above mentioned needs.

It is a related object of this invention to provide improved stencil making methods, apparatus and articles which avoid premature hardening tendencies of employed solutions.

It is also an object of this invention to eliminate the traditional light and temperature sensitivity and limited shelf life of sensitized stencil blanks or articles.

It is also an object of this invention to provide improved stencil blank and kits.

It is also an object of this invention to provide improved methods, apparatus and articles for providing designs and ornamentations on ceramics and various other objects and surfaces.

It is a further object of this invention to provide improved methods, apparatus and articles for closing a division between separate parts, such as for the purpose of repairing or joining various objects in a durable and tight manner.

Other objects will become apparent in the further course of this disclosure.

From a first aspect thereof, the subject invention resides in methods and apparatus for making a stencil of a desired design with the aid of first and second individually soluble substances being hardenable in admixture, and, more speciically, resides in the improvement comprising, in combination, the steps of, or means for, providing a foraminous stencil blank, impregnating the foraminous stencil blank with the first substance, storing the second substance in a pen separately from the impregnated stencil blank, employing the pen for applying the separately stored second substance to the impregnated stencil blank in the form of the design for admixture with the first substance only immediately prior to a desired selective hardening of the admixed first and second substances, selectively exposing the stencil to hardening of the admixed first and second substances, for rendering part of the stencil imperforate, and exposing the stencil to dissolution of any applied first and second substances outside of said part, for rendering the stencil perforate outside of said part.

From another aspect thereof, the subject invention resides in a method or apparatus for making a stencil of a desired design, comprising, in combination, the steps of, or means for, providing first and second individually soluble substances being hardenable in admixture, providing a foraminous stencil blank, impregnating the foraminous stencil blank with the first substance by applying the first substance uniformly to the foraminous stencil blank, thereafter applying the second substance to a pen separately from the impregnated stencil blank, employing the pen for applying the second substance to selected areas of the stencil blank in the form of the design for admixture with the applied first substance in said areas only immediately prior to a desired selective hardning of the admixed first and second substances, subjecting the stencil to hardening of the admixed first and second substances, whereby the stencil is imperforate in said areas, and subjecting the stencil to dissolution of the first substance outside the selected areas, whereby the stencil is perforate outside said areas.

From another aspect thereof, the subject invention resides in a method or apparatus for making a stencil of a desired design with the aid of first and second individually soluble substances being hardenable in admixture, comprising, in combination, the steps of, or means for, providing a foraminous stencil blank, impregnating the foraminous stencil blank with the first substance, storing the second substance separately from the impregnated stencil blank in a carrier adapted to be coextensive with only selected areas of the impregnated stencil blank where hardening is to occur, admixing the separately stored second substance to the impregnated stencil blank in the selected areas by driving the second substance from the carrier into the selected areas of the impregnated stencil blank for admixture with the first substance immediately prior to a desired selective hardening of the admixed first and second substances exposing the stencil to hardening of the admixed first and second substances, to render the stencil imperforate in said selected areas, and subjecting the stencil to dissolution of the first substance outside the selected areas, so as to provide the desired design by rendering the stencil perforate in said areas.

From another aspect thereof, the subject invention resides in a method of providing a design on a surface, comprising, in combination, the steps of providing first and second individually soluble substances being hardenable in admixture, applying the first substance to said surface, applying the second substance in the form of said design to the first substance on said surface for admixture with the first substance in the form of the design, exposing the admixture of the first and second substances to hardening, and dissolving the first substance outside the admixture away from said surface whereby the design manifested by the hardened first and second substances remains on said surface.

From another aspect thereof, the subject invention resides in a method of closing a division between separate parts, comprising, in combination, the steps of providing first and second individually soluble substances being hardenable in admixture upon exposure to light, applying the first substance to said parts and over said division, applying the second substance to said first substance on said parts and over said division in admixture with the first substance, exposing the admixture to light for hardening on said parts and over said division, and dissolving the first substance outside the admixture away from said parts.

The subject invention resides also in further methods herein disclosed, as well as in stencils made by methods according to the subject invention, to articles of manufacture and to apparatus for making stencils; no limitation to any method, apparatus, combination article, component or feature being intended by this summary of the invention.

BRIEF DESCRIPTION OF THE DRAWINGS

The subject invention and its various aspects and objects will become more readily apparent from the following detailed description of preferred embodiments thereof, illustrated by way of example in the accompanying drawings, in which like reference numerals designate like or functionally equivalent parts, and in which:

FIGS. 4 to 10 are illustrations of stencil making methods and equipments and stencils made according to a preferred embodiment of the subject invention;

FIGS. 11 to 16 are illustrations of stencil making methods and equipments and stencils made according to a further preferred embodiment of the subject invention;

FIGS. 17 to 20 are illustrations of stencil making methods and equipments and stencils made according to a futther preferred embodiment of the subject invention;

FIGS. 21 to 26 are illustrations of various modifications within the scope of the subject invention; and FIG. 27 is a top view of a stencil blank and test strip according to an embodiment of the subject invention, and a diagrammatic illustration of testing and exposure metering methods and systems.

DESCRIPTION OF PREFERRED EMBODIMENTS

Figure 1:
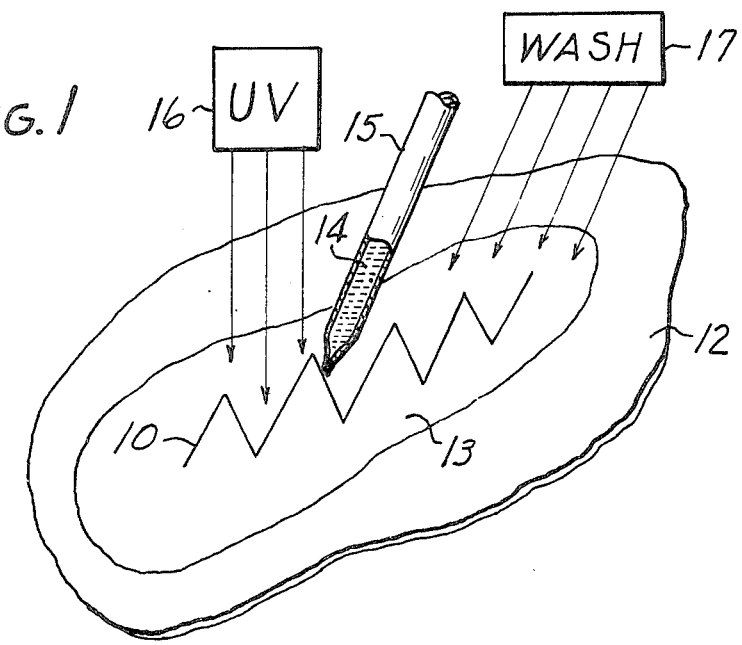
FIG. 1 is a diagrammatic illustration of a method of providing a design according to an embodiment of the subject invention.

An object of the method shown in FIG. 1 is to provide a design on an object or surface 12. To this end, first and second individually soluble substances 13 and 14 being hardenable in admixture may be provided. The first substance 13 is applied to the surface 12 prior to the second substance 14. As seen in FIG. 1, the first substance 13 may be applied to the surface 12 over an area larger than the area of the intended design 10. The first substance 13 may thus be applied somewhat arbitrarily, in a manner not limited by any particular design.

The second substance 14 is applied in the form of the desired design to the first substance 13 on the surface 12, for admixture with the first substance 13 in that form of the desired design 10. By way of example, a writing pen 15 containing a supply of the second substance 14 may be employed for applying the second substance to the first substance 13 on the surface 12.

The admixture of the applied first and second substances 13 and 14 is exposed to hardening, as indicated by the block 16 in FIG. 1. By way of example, and not be way of limitation, ultraviolet light may be employed for this purpose, if the first and second substances are hardenable in admixture upon exposure to ultraviolet light or to other light having an ultraviolet component.

Thereafter, the first substance 13 outside its admixture with the applied second substance 14 is dissolved away from the surface 12.

For instance, as indicated by the block 17 in FIG. 1, the soluble bulk of the first substance 13 may be washed away from the surface 12.

Figure 2:
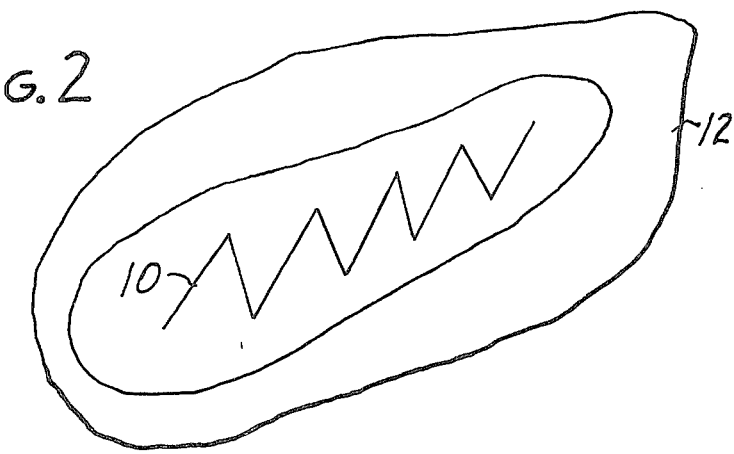
FIG. 2 is an illustration of a design made by a method according to FIG. 1.

As seen in FIG. 2, the design 10 in the form of the hardened admixture of the first and second substances 13 and 14 thus remains on the surface 12.

By way of example, and not by way of limitation, the first and second substances 13 and 14 upon admixture may constitute a photosensitive emulsion hardenable by exposure to light or another photo-stimulant. In that case, the second substance 14 may be the sensitizer for the photosensitive emulsion, while the first substance 13 may be the part of the emulsion lacking its sensitizer for photosensitivity. The first substance 13 may thus be called "emulsion base" which becomes the photosensitive emulsion upon admixture with the second or sensitizer solution 14.

Also by way of example, suitable photosensitive emulsions for present purposes include diazo direct photo emulsions of the type frequently employed for making stencils for screen printing purposes.

For instance, popular screen printing polyvinyl acetate and polyvinyl alcohol emulsions may be employed at 13, with a diazo sensitizer being used at 14 for controlled admixture with the applied polyvinyl acetate or polyvinyl alcohol emulsions. Other types of emulsion bases 13 which have been used and with which the screen 25 may be impregnated include gelatine, polyvinyl alcohol, polyvinyl alcohol-polyvinyl acetate, egg albumin, gum arabic, shellac, and animal glue. Sensitizers 14 for these emulsions include potassium dichromate, $K_2Cr_2O_7$, ammonium dichromate $(NH_4)_2Cr_2O_7$, and sodium dichromate, $Na_2Cr_2O_7$.

Summarizing thus a preferred embodiment of the subject invention, it is seen that, according to FIG. 1, a potentially photosensitive emulsion base 13 is applied to the surface 12 in a somewhat arbitrary manner, and that a photo-sensitizer 14 is then applied to the emulsion base 13 in a controlled manner to produce the desired design 10 upon exposure to ultraviolet light 16 and dissolution of the non-admixed emulsion base 13 from the surface 12, such as by a washing step 17, whereby the design 10 manifested by the hardened photosensitive emulsion remains on the surface 12.

In general, it is at least presently assumed for the case of sensitized emulsions, that the first substance typically will be the emulsion without the sensitizer, also called "emulsion base," and that the second substance then will be the sensitizer for rendering the emulsion base hardenable upon exposure to ultraviolet or other light. However, that need not necessarily be the case. For instance, the sensitizer could be applied at 13 in the example of FIG. 1 with the emulsion base then being supplemented at 14 via the pen 15 to generate the hardenable admixture in the form of the design 10. In other words, in all embodiments herein shown or disclosed, what is called first emulsion could be the sensitizer, while the emulsion base then constitutes the second substance.

In general, the first emulsion 13 is preferably dried on the surface 12 before the second emulsion 14 is applied thereto.

In fact, the object or surface 12 may be impregnated or coated with a layer of the first substance 13, and the second substance 14 may be stored for longer periods of time separately from the impregnated or coated object or surface 12, to be applied to the coating 13 or impregnated object 12 only at the moment the design 10 is to be created.

In practice, the design 10 may be applied in the manner herein disclosed to ceramic objects, sheet metal, glass, plastics, foil, sheet materials and all kinds of objects and surfaces. Using materials of the type herein disclosed, I have produced all kinds of designs and decorations on various objects, including ceramics and glass without the use of any kiln usually associated with the production of that kind of decoration. Remarkably, the designs and ornamentations thus produced adhered to the surface of object 12 with incredible tenacity, were considerably elastic and gave the appearance of the type of hard glazing as was heretofore produced only with the aid of an expensive and carefully operated kiln.

My invention extends also to the designs and various objects as may be produced by the method shown in FIGS. 1 and 2 or otherwise herein disclosed.

I have also discovered that methods herein disclosed are ideally suited to repairing or uniting various objects. This may be expressed in terms of a closing of a division between separate parts in a broad sense, as will presently be explained with the aid of FIG. 3.

Figure 3:
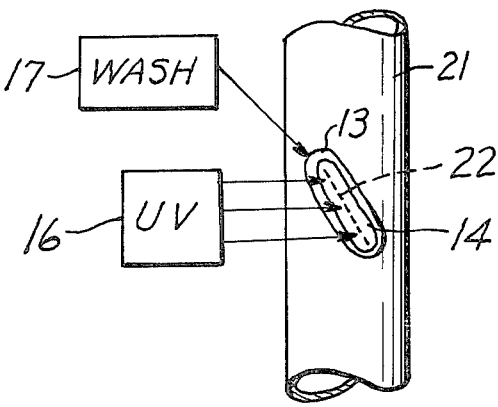
FIG. 3 is a somewhat diagrammatic illustration of a repair method according to an embodiment of the subject invention, and of a repaired article.

By way of example, FIG. 3 shows an object, such as a pipe 21 which has a crack or division 22 therein. The "separate parts" just mentioned thus are the portions of the pipe 21 on opposite sides of the division or crack 22.

Again, first and second individually soluble substances being hardenable in admixture upon exposure to light are provided. The first substance, such as a photo-emulsion base, is applied to the parts of the object 21 over the division 22, as shown at 13 in FIG. 3. After the applied first substance has dried, the second substance 14, such as a sensitizer for the base emulsion, is applied to the first substance 13 on the parts of the object 21 and over the division 22, in admixture with the first substance.

The thus admixed first and second substances 13 and 14 are then exposed to actinic light, as indicated at 16 in FIG. 3, for hardening on the parts of the object 21 and over the division 22. The portions of the first substance 13 outside such admixture may then be dissolved away from the parts of the object 21, or from such object itself. As indicated at 17 in FIG. 3, washing may be employed for that purpose. Since the exposed admixture of the substances 13 and 14 has hardened, it will not be washed away, but will form a flexible but tough coating or patch over the crack or division 22.

While the repair of a pipe or other object has been illustrated in FIG. 3, the same procedure may be employed for joining different pipes or other objects together, as desired.

The result is an article of manufacture or assembly including a closed division between separate parts, made by a method as herein disclosed with reference to FIG. 3, and the exposed admixed coatings 13 and 14 shown therein.

Other aspects of the invention may, for instance, be practised with the aid of foraminous sheets or stencil blanks 25 as shown somewhat diagrammatically in FIGS. 4 et seq. By way of example, foraminous sheets include such items as silk screens or screens of a polyester fabric or of any other material used or useful in screen printing or serigraphy, wire mesh or apertured sheet material.

Sometimes, the foraminous blank or screen 25 will be mounted in a frame which, however, has not been shown in FIGS. 4 et seq., since it may be of a conventional type and would by its showing not contribute to an understanding of the subject invention.

As seen in FIG. 5, the foraminous stencil blank 25 is impregnated with the first substance 13. The second substance 14 is stored separately from the impregnated stencil blank.

In this manner, the impregnated stencil blank has an almost unlimited shelf life. This stands in favorable contrast to those prior-art approaches in which the emulsion base and sensitizer were admixed into a photosensitive emulsion prior to their application to the stencil blank.

Also, both the impregnated stencil blank by itself and the sensitizer by itself can be exposed to light without detriment thereto. This also stands in favorable contrast to prior-art approaches requiring working in a dark room or with an opaque enclosure.

The separately stored second substance 14 is applied to the impregnated stencil blank for admixture with the first substance 13 only immediately prior to a desired selective hardening of the admixed first and second substances 13 and 14. For instance, as shown in FIG. 6, a pen 15 may be employed for applying the second substance 14 to the impregnated stencil blank in the form of a design 10.

The stencil is thereupon exposed to hardening of the admixed first and second substances 13 and 14 as to render part of the stencil imperforate, as shown at 26 in FIGS. 8 and 9. Ultraviolet light or other actinic radiation may be employed for this purpose, as indicated at 16 in FIG. 7.

The stencil may thereupon be exposed to dissolution of any applied first substance 13 outside of the imperforate part 26, so as to render the stencil perforate outside of that part. As shown at 17 in FIG. 8, washing of the stencil may be employed for this purpose, whereby unhardened portions of the first substance are washed away from the screen 25.

As shown in FIG. 9 at 27, printer's ink or paste may be applied to the stencil, which will stop or block the ink with the hardened part 26, but will permit penetration of the ink through the perforate areas thereof to a sheet of paper 28 or other substance.

The result is a negative image 31 of the design 10, in which printer's ink deposits 29 border blank portions 32 representing the design 10.

From another aspect thereof, the embodiment of the invention shown in FIGS. 4 to 8 may be defined in terms of providing first and second individually soluble substances 13 and 14 being hardenable in admixture, providing a foraminous stencil blank 25, and applying the first substance 13 uniformly to the perforated stencil blank, without applying the second substance 14 at that time.

The expression "uniform" as herein employed may denote application of the first substance 13 to all foraminous portions of the screen 25. However, "uniform" may in practice denote application of the first substance 13 to the foraminous blank 25 in a non-image like manner. By contrast, the second substance 14 is applied in an image-like manner in the embodiment shown in FIG. 6.

In particular, the second substance 14 is applied to selected areas of the stencil blank for admixture with the previously applied and dried first substance in such areas, which may, for instance, represent the design 10.

The stencil is thereupon subjected to hardening of the admixed first and second substances as shown, for instance, in FIG. 7, whereby the stencil is imperforate in the areas 26. Of course, the subject invention could be practised by rendering only one area of the stencil blank imperforate, and the term "areas" as herein employed is intended to cover that possibility also, along with the more likely procedure of rendering two or more areas or regions of the stencil blank imperforate.

As illustrated in FIG. 8, the stencil is again subjected to dissolution of the first substance 13 outside the selected areas 26, whereby the stencil is perforate outside such areas, for the printing of negative images relative to the applied design 10.

A positive stencil and image making method is shown in FIGS. 11 to 16. According to FIG. 11, part of the impregnated stencil blank is covered against penetration by the second substance 14. By way of example, one or more pieces of imperforate sheet stock 33 shaped in correspondence to the stencil areas which are to remain perforate, may be applied to the impregnated stencil blank, as shown in FIG. 11.

When the second substance is then applied to the impregnated stencil blank and imperforate sheet pieces 33, the applied second substance can only admix itself with the first substance 13 where the stencil blank is not covered by the pieces 33.

Suitable means for applying the second substance 14 to the partially covered stencil blank include an applicator 34 having a sponge 35 through which the substance 14 can flow to the stencil blank.

The cover pieces 33 may be removed prior to the exposure of the stencil blank to actinic radiation. On the other hand, as shown in solid lines in FIG. 13, the cover pieces 33 may be left in place when the stencil blank is exposed to actinic radiation. In either case, hardening will only take place in the areas 26 outside of the cover pieces 33, where an admixture of applied first and second substances 13 and 14 has taken place.

As indicated in FIG. 14, the unadmixed first substance 13 may then be washed out of the screen 25, whereby the hardened imperforate areas 26 will remain.

FIGS. 11 to 14 are also diagrammatically illustrative of a method providing a layer 33 coextensive with the impregnated stencil blank and having openings corresponding to the selected areas 26. In this respect, dotted portions 36 in FIG. 11 indicate extensions of the layer 33, which then provides openings 37 through which the second substance 14 is applied to selected areas of the impregnated stencil blank, when the second substance 14 is applied in the manner shown in FIG. 12 or by another method, such as spraying from a pressurized can.

Imperforate hardened portions 26 will then be formed in areas corresponding to the openings 37 in the layer 33.

According to a further embodiment of the subject invention, the second substance 14 is uniformly applied to the impregnated stencil blank, but only immediately prior to the desired selected hardening thereof. The stencil is then exposed to hardening of the admixed first and second substances 13 and 14 only in the parts 26 of the stencil.

In terms of FIGS. 11 to 14, this may be accomplished by omitting initially the cover 33, and by constituting such cover as a light mask. If the cover 33 is initially omitted, then the applicator 34 will uniformly cover the impregnated stencil blank with the second solution 14 on top of the previously applied first solution 13.

In order to prevent hardening of the entire stencil blank, the cover 33 is employed as a mask against the penetration of actinic radiation, as diagrammatically indicated in dotted outline at 39 in FIG. 13. Of course, the mask 39 could be applied on top of the stencil blank bearing the then admixed first and second substances 13 and 14.

The mask 39 selectively keeps actinic radiation away from the stencil blank, and thus prevents hardening of admixed first and second substances 13 and 14 outside of the areas 26. Accordingly, the stencil will only have hardened admixed first and second substances in the areas 26, and the admixed but unhardened first and second substance portions will be washed out of the screen 25 in the method steps shown in FIG. 14.

Accordingly, all the embodiments disclosed with the aid of FIGS. 11 to 14 provide a stencil blank having imperforate hardened areas 26 alternating with one or more perforate areas 41 corresponding to the cover or masking layer 33.

When ink is applied to the formed stencil as indicated at 27 in FIG. 15, ink can only penetrate the perforate areas 41, being stopped by the imperforate hardened areas 26. Accordingly, the resulting pattern of ink deposits 29 and blank areas of the sheet 28 present a positive image 42 of the original cover pattern 33 which selectively prevents penetration of the second substance 14 to the impregnated stencil, or of the masking pattern 39 which selectively limits light exposure of the impregnated stencil blank to the part or parts 41 of the stencil which are to become perforate, as shown in FIG. 15.

A further preferred embodiment of the subject invention which may, for instance, be employed for making positive prints or images, is illustrated in FIGS. 17 to 20. That further embodiment employs a soluble third substance 45 which has the property of chemically inhibiting hardening of the first and second substances 13 and 14 in admixture. Substances of this kind are known as such and include, for instance, certain enzymes and photostencil remover liquids generally employed, as their name implies, for removing excessive or hardened photo emulsion from the stencil or screen 25.

Suitable enzymes include proteolytic enzymes, papain and pepsin, as the third substance 45.

For polyvinyl alcohol base emulsions, alkali substances, such as sodium hypochloride, potassium hydroxide, or sodium hydroxide, may be employed at 45.

A pen 15 or other applicator may be employed for applying the third substance 45 to the impregnated foraminous stencil blank 25 which already contains the typically uniformly applied first substance 13.

The third substance 45 is preferably applied to the impregnated stencil blank in the form of a desired design 10, or is otherwise applied only to selected areas of the stencil blank to inhibit hardening of the first and second substances 13 and 14 in those areas. As before, the second and third substances 14 and 45 are stored separately from the impregnated stencil blank which contains the first substance 13. The separately stored second and third substances are then selectively applied to the impregnated stencil blank only immediately prior to a desired selective hardening of the admixed first and second substances.

As seen in FIG. 18, the applied third substance 45 admixes itself with the previously applied and dried first substance 13 in the particular selected areas 46. The second substance 14 may then be applied uniformly to the stencil blank, such as by way of an applicator 34, as illustrated in FIG. 18.

As illustrated in FIG. 19, the stencil may then be subjected to hardening of the admixed first and second substances, such as by irradiation with ultraviolet or other actinic light 16, whereby the stencil becomes imperforate outside the areas 46, as indicated at 26 in FIG. 20.

In particular, since the third substance 45 inhibits hardening of the admixed first and second substances 13 and 14 in areas 46, such admixed first and second substances 13 and 14 can only harden outside the areas 46.

If the stencil is then washed out as illustrated in FIG. 20, or is otherwise subjected to dissolution of the first and second substances 13 and 14 in the selected areas 46, the stencil becomes perforate in those areas 46, while remaining imperforate in the areas 26, as seen in FIG. 20.

Positive prints may then be made from the stencil shown in FIG. 20. By way of example, the inking method illustrated in FIGS. 15 and 16 may be employed for this purpose.

In practice, various methods, such as writing, spraying or printing, may be employed for applying the third substance 45 to the impregnated stencil blank. For instance, the application method illustrated in FIG. 11 may be borrowed for selectively applying the third substance 45 to the impregnated stencil blank. In other words, a layer 33, 36 coextensive with the impregnated stencil blank and having openings 37 corresponding to the selected areas 46 may be applied to the impregnated stencil blank. The third substance 45 may then be applied through such openings of the coextensive layer 33, 36 to the selected areas 46 of the impregnated stencil blank, such as by means of spraying or by way of an applicator 34 which uniformly applies the third substance to the coextensive layer 33, 36 and, through its openings 37, also to selected areas 46 of the impregnated stencil blank.

The coextensive layer 33, 36 may then be removed and the second substance 14 applied uniformly to the stencil blank, in the manner indicated in FIG. 18. Alternatively, the second substance 14 may be applied to the stencil blank through a surface opposite the layer 33, 36, after the impregnated stencil blank has been provided with the third substance 45 in selected areas 46.

A further embodiment of the subject invention, which may be applied to other embodiments herein disclosed, blocks exposure of the stencil blank or stencil to penetration of light through a first surface of that stencil, and exposes the stencil to light for the hardening of the admixed first and second substances 13 and 14 through a second surface of the stencil opposite the mentioned first surface.

For instance, as shown in FIG. 21, the impregnated stencil blank may be provided with an opaque layer or cover 51 on a first surface of the stencil blank. The second substance may then be applied to the impregnated stencil blank through a second surface 53 opposite the first surface. Application methods of the type disclosed above with the aid of FIGS. 6 and 12 may be employed for the second substance 14 in the embodiment of FIG. 21. The stencil blank may then be exposed to ultraviolet light or other actinic radiation through the second surface 53 of the stencil opposite the first surface 52, whereby the desired selective hardening of admixed first and second substances 13 and 14 will take place.

This light exposure may be carried out in the manner illustrated in FIG. 7, with the difference that the opaque backing layer 51 will block light irradiation through the first stencil surface 52.

Provision and employment of the opaque backing layer 51 has the advantage that the entire stencil making method may be carried out in a well-lit environment; dispensing with the need of a darkroom.

As indicated at 55 in FIG. 21, the back cover 51 may be pealed off the stencil after exposure thereof. The stencil may then be washed such as in the manner shown in FIG. 8, with imperforate portions 26 remaining where there was an effective admixture of the first and second substances 13 and 14.

Alternatively, the layer 51 may be of an opaque water-soluble type. Various inks and marker substances which do not harden upon drying may be employed for this purpose. The water-soluble layer 51 will then wash off together with soluble portions of the first substance 13, when the stencil is subjected to the washing process, such as, for instance, indicated in FIG. 8.

If the backing layer 51 is water soluble or pregnable, the second substance 14 may be applied through such backing layer to the impregnated stencil 13, 25. As illustrated in FIG. 22, an applicator 35 may be employed for this purpose and may be wiped across the pregnable backing layer 51.

As also indicated in FIG. 22, an opaque mask 39 may be employed during exposure to ultraviolet or other actinic irradiation 16, in order to shield the stencil blank in areas where no hardening of admixed first and second substances 13 and 14 is to take place. Since the backing layer 51 is opaque to light, stray radiation 57 cannot affect the development process which may thus be carried out in daylight or an artificially lit room, without the need of a darkroom.

It may be well at this juncture to consider that the mask 39 shown, for instance, in FIGS. 13 and 22, as well as the selectively applied layer 33 shown also in FIGS. 11 to 13, may, for instance, be produced by wax crayons, fatty crayons, tusche, India ink and other opaque inks which are easily washed off after the actinic light exposure. Reference may in this respect be had to my above mentioned prior U.S. Pat. No. 4,142,464, which discloses various means and methods for providing desired design or image patterns on the stencil blank, including, for instance, also transfer lettering, flat blockout objects, transparencies, dried leaves and similar devices.

Figure 23:
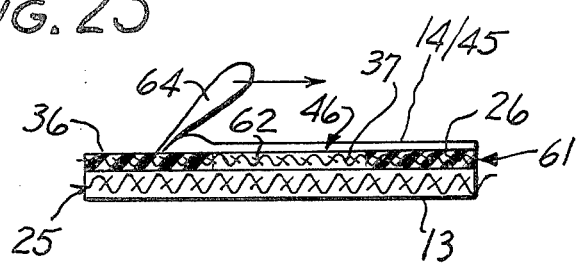

The embodiment shown in FIG. 23 is somewhat akin to the embodiment disclosed above with reference to the extended layer portions 36 in FIG. 11. In particular, the embodiment of FIG. 23 uses a stencil 61 which has the above mentioned openings 37 in a screen or foramen 62 which corresponds to the screen or foramen 25 of the stencil blank. In fact, the stencil 61 may, for instance, be produced by the method shown in FIGS. 4 to 8, or the method shown in FIGS. 11 to 15, or the method shown in FIGS. 17 to 20, with or without the features of FIGS. 21 and 22.

The stencil 61 may thus have imperforate portions 26 and perforate portions 46.

As seen in FIG. 23, the stencil 61 is applied to a foraminous stencil blank impregnated by the first substance 13. The stencil 61 may thereby act as a layer coextensive with the impregnated stencil blank 25, 13 and having openings 46 corresponding to the selected areas 26 (see FIGS. 8, 9, 14 and 15) where hardening of the stencil blank is to take place, or corresponding to the areas 46 (see FIGS. 18 to 20) where the stencil blank is to become perforate to ink or other applied substances.

The second substance 14 or alternatively the third substance 45 may be applied through the openings 46 of the stencil 61 to the impregnated stencil blank 25, 13, by spraying the top stencil 61.

Alternatively, and as shown in FIG. 23, an elastic blade or squeegee 64 may be employed for forcing the second substance 14 or the third substance 45 through the openings 37 or perforate area 46 of the top stencil 61 through to corresponding unterlying areas of the impregnated stencil blank 25, 13. The second substance 14 or the third substance 45 may be incorporated in a paste-like carrier for this purpose. By way of example, gelatine or cornstarch may be employed as a carrier for the second substance 14 or third substance 45. In practice, the method shown in FIG. 23 may, for instance, be employed for converting a negative image produced in the stencil 61, such as by a method as disclosed in connection with FIGS. 4 to 8, into a positive image in the stencil blank 25, 13.

At any rate, the stencil blank processed in the manner shown in FIG. 23 may be further processed and handled as shown, for instance, in FIGS. 7 to 10 or in FIGS. 18 to 20.

A further method of applying the second substance 14 to the impregnated stencil blank includes the steps of providing the second substance in a carrier extending along and across the impregnated stencil blank, and driving the second substance from such carrier into the impregnated stencil blank immediately prior to the selective hardening process.

Figure 24:
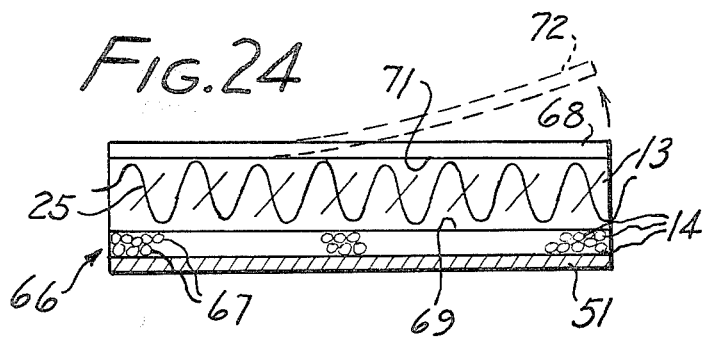
Figure 25:
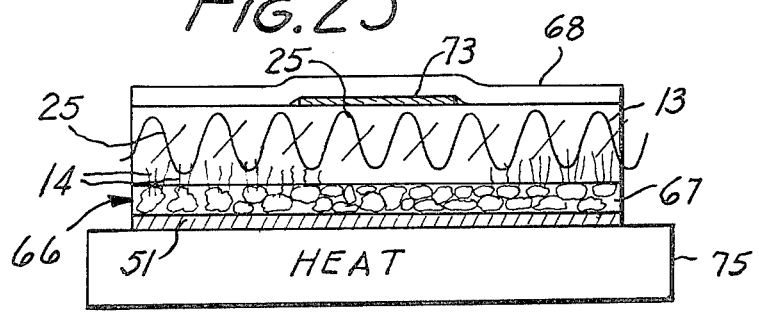

By way of example, FIGS. 24 and 25 illustrate an embodiment of the latter aspect of the invention.

In particular, the embodiment of FIGS. 24 and 25 provides the second substance 14 in a carrier 66 comprising burstable thin-walled blisters or bubbles 67 which contain the second substance 14 therein. While the foraminous stencil blank 25 is impregnated with the first substance 13, the second substance 14 is kept isolated therefrom by the bubbles 67 in the carrier 66 adjacent the impregnated stencil blank. The bubbles 67 may be opaque to obstruct stray light from penetrating to the stencil blank. Alternatively, the carrier layer 66 may be provided with an opaque backing 51 of the type described above.

The stencil blank may have a top layer 68 opposite the carrier layer 66. This top layer is preferably transparent to light, which is possible due to the fact that the stencil blank according to the subject invention is not light sensitive prior to application of the second substance 14 thereto. A thin Mylar sheet may be employed as the top layer 68.

The bottom carrier layer 66 and the top layer 68 each may be releasably retained on the impregnated stencil blank by a tacky adhesive 69 or 71, permitting peeling of the particular layer from the stencil blank.

For instance, the top layer 68 may first be lifted as indicated at 72 in FIG. 24 and an opaque object or design 73 may then be inserted between the lifted top layer 68 and the stencil blank. As shown in FIG. 25, the lifted top layer 68 may then be returned to the stencil blank for a releasable retention of the design or object 73 thereon.

Immediately prior to exposure, the bubbles 67 in the carrier layer 66 are burst and the second substance 14 is driven into the impregnated stencil blank, in admixture with the first substance 13 located therein. As indicated in FIG. 25, heat from a heat plate 75 or other heat source acting on the carrier layer 66 or through the bottom backing 51 may be employed for this purpose. The sensitized stencil blank may then be exposed to ultraviolet light or other actinic radiation, such as in the manner shown in FIG. 13, whereby the opaque design or object 73 will block hardening of admixed first and second substances 13 and 14 in the selected area or areas 25 below the object 73. The top and bottom layers 51 and 68, and whatever is left of the layer 66 may then be removed from the exposed stencil, which may thereupon be washed out as illustrated, for instance, in FIG. 14, whereby distinct perforate and imperforate areas 25 and 26 are produced. Images or prints may then be generated in the manner illustrated in FIGS. 15 and 16, for instance.

Figure 26:
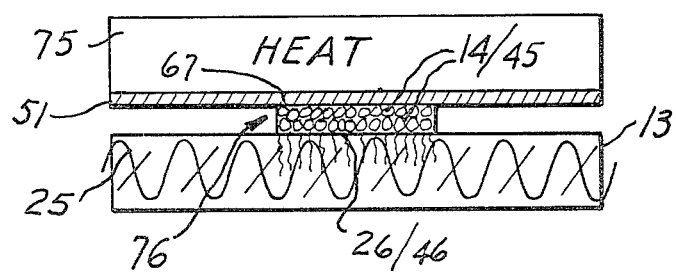

Instead of, or in addition to, heat, pressure may be used at 75 in FIGS. 25 and 26 to burst the bubbles 67 and drive the substance 14 or 45 into the impregnated stencil blank.

A further embodiment of the subject invention provides the second substance 14 in a carrier coextensive with only selected areas 26 of the impregnated stencil blank where hardening of the stencil is to occur. As seen in FIG. 26, the latter carrier 76 may comprise burstable thin-walled bubbles 67 containing the second substance 14 in isolation from the first substance 13 in the impregnated stencil blank. The second substance 14 is then applied to the selected areas 26 by driving such second substance from the carrier 76 into the impregnated stencil blank immediately prior to the desired selective hardening thereof. Again, heat or pressure from a plate 75, acting through a backing layer 51, may be employed for bursting the bubbles 67 and driving the second substance 14 into the impregnated stencil blank at the areas 26.

The impregnated stencil blank, having the second substance 14 thus admixed with the first substance 13 in selected areas 26, may then be exposed to ultraviolet or other actinic light, generally in the manner shown in FIG. 7, whereupon hardened areas 26 will be generated. The nonadmixed portions of the first substance 13 may thereupon be washed out, such as in the manner indicated in FIG. 8, and prints may be produced, such as in the manner shown in FIGS. 9 and 10.

Since the carrier layer 66 is longer and wider than the selected areas 26, the smaller carrier 76 may be derived from such larger carrier in the form of a portion thereof corresponding in size and shape to the selected areas 26.

To this end, the larger carrier layer 66 may be provided by itself, and the smaller carrier 76 may be cut and shaped therefrom.

The method illustrated in FIGS. 17 to 20 may also be implemented with the aid of the method shown in FIG. 26. For that purpose, the third substance 45, rather than the second substance 14 is provided in the bubbles 67 of the carrier 76. Such carrier 76 is shaped to conform to the selected areas 46 which, as for instance shown in FIG. 20, are to become perforate, while the remainder of the stencil blank is made imperforate.

If desired, the third substance 45 may be provided in a carrier, such as the carrier 66, which is longer and wider than the selected areas 46. The smaller carrier portion 76 may then be derived from the carrier 66 in a size and shape corresponding to the selected areas 46. The third substance 45 is then applied to the selected areas 46 by driving such third substance from the carrier portion 76 into the impregnated stencil immediately prior to the desired selective hardening. Again, the heat plate 75 or another heat source and/or pressure may be employed for that purpose.

Once the third substance 45 has thus been administered to the impregnated stencil blank, the second substance 14 is applied thereto. The application of the second substance proceeds typically in a uniform manner, such as by spraying, or by means of an applicator 43 (see, for instance, FIG. 12) or a bubble layer 66 (see, for instance, FIG. 25). The prepared stencil blank may then be exposed and further processed as shown, for instance, in FIGS. 19 and 20.

The subject invention extends also to kits, articles and apparatus for making a stencil by selective hardening of first and second individually soluble substances 13 and 14 being hardenable in admixture According to the subject invention, such apparatus include a foraminous stencil blank 25 impregnated with the first substance 13, means 15, 34 or 66 for storing the second substance separately from the impregnated stencil blank, and for applying such separately stored second substance 14 to the impregnated stencil blank for admixture with the first substance 13 only immediately prior to a desired selective hardening of the admixed first and second substances.

The apparatus under consideration may also include means 16 for exposing the stencil blank to hardening of the admixed first and second substances 13 and 14 as to render part of the stencil blank imperforate, such as the part 26 shown in FIGS. 8, 9, 14, 15, and 20, for instance. The apparatus under consideration may also include means 17 for exposing the stencil blank to dissolution of any applied first and second substances 13 and 14 outside of the part 26 so as to render the stencil blank perforate outside of that part; that is, at the areas 46 shown in FIG. 20, for instance.

The apparatus under consideration may also include a backing 51 permeable to the second substance 14 on the stencil blank, and means 35 for applying the separately stored second substance 14 through such backing 51 to the impregnated stencil blank.

For other apparatus of the subject invention, reference may be had to the above description of various figures of the accompanying drawings.

By way of example, and not by way of limitation, the apparatus under consideration may include means 15 for containing a soluble third substance 45 inhibiting hardening of the first and second substances in admixture and for applying such third substance to selected areas of the stencil blank, such as shown in FIG. 17, for inhibiting hardening of the first and second substances 13 and 14 in such areas 46.

The apparatus under consideration may include means, such as shown at 76 in FIG. 26, for applying the third substance 45 to the selected areas 46 of the impregnated stencil blank.

The apparatus under consideration may include means, such as an applicator 34 shown in FIG. 18 or a carrier layer 66 shown in FIG. 24, for applying the second substance 14 uniformly to the stencil blank.

Articles according to the subject invention may also include stencil blanks, screens or fabrics impregnated with only the above mentioned first substance 13, without the second substance 14. For instance, if the second substance 14 is a sensitizer, the stencil blank, screen or fabric 25 may be impregnated with the emulsion base 13. Preferably, such emulsion base is dried in the stencil blank, screen or fabric after application thereof. However, the sensitizer is lacking from such applied and dried emulsion base, so that the impregnated stencil blank, screen or fabric is not light sensitive and has a long shelf life prior to application of the second substance 14 or second and third substances 14 and 45 thereto.

The need for any darkroom may be obviated by providing the stencil blank, screen or fabric, bearing the applied and dried third substance 13, with an opaque backing layer, such as the layer 51 shown in FIG. 21 or FIG. 22, and described above in connection therewith.

By way of example, and not by way of limitation, FIG. 27 addresses itself to exposure metering or other testing procedures and equipment that may advantageously be applied to the practice of the subject invention or to the practice of other stencil-making methods.

For instance, FIG. 27 addresses itself to methods and apparatus for making a stencil from a foraminous stencil blank 25 in which first and second individually soluble substances 13 and 14 are hardened in admixture in selected areas of the stencil blank and have a specific appearance upon sufficient hardening of such areas. In this respect, the methods and apparatus presently under consideration may, for instance, be applied to the stencil-making method of FIGS. 4 to 8 or FIGS. 17 to 20, which produce hardened imperforate areas 26 which display a specific appearance upon hardening with the aid of ultraviolet light 16 or other actinic radiation. In practice, such appearance of the hardened areas 26 is different from the appearance of either the first substance 13 with or without a conventional dye, or the second substance 14 by itself. Such appearance is also different from the unhardened admixture of the first and second substances.

The aspect of the invention illustrated in FIG. 27 provides a foraminous test strip 81 which, for instance, may be of the same material as the previously described screen 25, shown also in the left-hand portion of FIG. 27. The screen 25 of the stencil blank, as well as the screen 25 of the test strip 81, is impregnated with the first substance 13, which is preferably dried in the screens 25.

The preferred embodiment illustrated in FIG. 27 further provides on a first region 82 of the foraminous test strip 81 a substance 83 having the specific appearance which is displayed by admixed first and second substances 13 and 14 after having attained sufficient hardening in the screen 25. In practice, the substance 83 may also be applied to an area 84 of the test strip which is spaced from the first region 82 by a second region 85 which carries the previously applied, dried first substance 13.

In practice, the substance 83 on the test strip 81 may be provided by impregnating test strip 81 with the first substance 13 in the first and second regions 82 and 85 and, if desired, in the area 84, and by applying the second substance 14 to the first region 82 and, if desired, to the spaced area 84 for admixture of the first substance in such first region 82 and area 84. Of course, this procedure also contemplates an alternative in which the first and second substances are already axmixed when they are applied to the first region 82 and spaced area 84.

At any rate, however, the first and second substances 13 and 14 are applied to the first region 82 and, if desired to the spaced area 84, prior to application of the second substance 14 to selected areas of the stencil blank and to the second region 85 of the test strip 81.

The admixed first and second substances in the first region 82 of the test strip and, if desired, in the spaced area 84 thereof, are then subjected to hardening prior to application of the second substance to selected areas of the stencil blank and to the second region 84 of test strip 81, until such admixed first and second substances 83 in the first region 82 and, if desired, in the spaced area 84, of the test strip 81 have the specific appearance of an imperforate stencil region having been suffiently hardened without overexposure.

Reverting now to the embodiment specifically illustrated in FIG. 27, the second substance 14 is applied to selected areas of the stencil blank for admixture with the first substance 13, such as shown in the form of a design 10 in FIG. 27. Practically simultaneously, the second substance 14 is also applied to the second region 85 of the test strip 81 for admixture with the first substance. As seen in FIG. 27, a pen 15 may, for instance, be employed for applying the second substance 14, as desired.

As indicated at 16 in FIG. 27, the stencil and the test strip are then subjected to hardening of their admixed first and second substances, until such admixed first and second substances in the test strip 81 display the specific appearance of sufficiently hardened but not overexposed imperforate portions; that is, the appearance of the previously applied substance 83.

In other words, the operator may watch the trace left by application of the second substance 14 to the second region 85 on the test strip 81 during the hardening process, and may interrupt the hardening process when such trace has acquired the appearance of the substance 83 or first region 82 and spaced area 84 of the test strip 81. In that case, the operator knows that the stencil is imperforate in the areas 10 shown in FIG. 27.

If the first and second substances 13 and 14 are hardenable upon exposure to light, ultraviolet or other actinic radiation may be employed at 16 for exposing the stencil and the test strip simultaneously to light for the hardening of their admixed first and second substances. The ultraviolet or actinic radiation source 16 is switched off when the trace of the second substance 14 on the second region 85 of test strip 81 has acquired the specific appearance of a sufficiently hardened but not overexposed admixture of the first and second substances. Overexposure of the stencil is thereby avoided, while sufficient hardening of the admixed first and second substances is assured therein.

The stencil thus prepared may be subjected to further processing, such as to the washing process 17 shown in FIG. 8, whereby the stencil is subjected to dissolution of the first substance outside the selected areas, where hardening has taken place. In other words, the stencil is rendered perforate outside the areas 26, as shown, for instance, in FIG. 8. The stencil may then be employed like any other stencil herein disclosed.

The method shown in FIG. 27, as well as the exposure methods shown in the other drawings, may be effected in sunlight or daylight.

The method disclosed with respect to FIG. 27 may also be employed in the practice of the embodiment shown in FIGS. 17 to 20, where a third substance 45 is applied to selected areas of the stencil blank prior to application of the second substance 14. In that case, the third substance is applied to the test strip 81 prior to application of the second substance 14. Of course, even if the third substance 45 is first applied to the impregnated stencil blank and the test strip, in the manner shown, for instance, in FIG. 17, it is still true that the second substance 14 is applied to selected areas of the stencil blank and to the second region 85 of test strip 81. However, in cases where the third substance 45 is first applied, the selected areas to which the second substance is thereafter applied may be the entire area of the stencil blank, as shown in FIG. 18, as well as part or the entire area of the second region 85 of the test strip 81.

The subject extensive disclosure will suggest or render apparent to those skilled in the art various modifications and variations within the spirit and scope of the subject invention and equivalents thereof.

I claim:

1. In a method of making a stencil of a desired design with the aid of first and second individually soluble substances being hardenable in admixture, the improvement comprising in combination the steps of:

providing a foraminous stencil blank;

impregnating said foraminous stencil blank with the first substance;

storing the second substance separately from said impregnated stencil blank;

applying the separately stored second substance to the impregnated stencil blank in the form of said design for admixture with the first substance only immediately prior to a desired selective hardening of the admixed first and second substances and exposing the stencil to hardening of the admixed first and second substances as to render part of the stencil imperforate; and exposing the stencil to dissolution of any applied first and second substances outside of said part so as to render the stencil perforate outside of said part.

2. A method as claimed in claim 1, including the steps of:

providing said stencil blank with a backing permeable to said second substance; and applying said separately stored second substance through said backing to said impregnated stencil blank.

3. A method as claimed in claim 2, including the step of:

exposing said stencil to hardening of the admixed first and second substances through a surface of the stencil blank opposite said backing.

4. A method as claimed in claim 1, wherein:

said first and second substances are made hardenable upon exposure to light; and said stencil is exposed to light for said hardening of the admixed first and second substances.

5. A method as claimed in claim 4, including the steps of:

blocking exposure of said stencil to penetration of light through a first surface of said stencil; and exposing said stencil to light for said hardening through a second surface of said stencil opposite said first surface.

6. In a method of making a stencil of a desired design with the aid of first and second individually soluble substances being hardenable in admixture, the improvement comprising in combination the steps of:

providing a foraminous stencil blank;

impregnating said foraminous stencil blank with the first substance;

storing said second substance separately from said impregnated stencil blank in a carrier adapted to be coextensive with only selected areas of the impregnated stencil blank where hardening is to occur;

applying the separately stored second substance to the impregnated stencil blank in said selected areas by driving said second substance from said carrier into said selected areas of said impregnated stencil blank for admixture with the first substance immediately prior to a desired selective hardening of the admixed first and second substances;

exposing the stencil to hardening of the admixed first and second substances to render the stencil imperforate in said selected areas; and exposing the stencil to dissolution of said first substance outside of said areas so as to provide said desired design by rendering the stencil perforate outside of said areas.

7. A method of making a stencil of a desired design, comprising in combination the steps of:

providing first and second individually soluble substances being hardenable in admixture;

providing a foraminous stencil blank;

applying the first substance uniformaly to said foraminous stencil blank;

thereafter applying the second substance to selected areas of the stencil blank in the form of said design for admixture with the applied first substance in said areas;

subjecting the stencil to hardening of the admixed first and second substances, whereby the stencil is imperforate in said areas; and subjecting the stencil to dissolution of the first substance outside said selected areas, whereby the stencil is perforate outside said areas.

8. A method as claimed in claim 7, wherein:

said first and second substances are made hardenable upon exposure to light; and said stencil is exposed to light for said hardening of the admixed first and second substances in said selected areas of the stencil.

9. A method as claimed in claim 8, including the steps of:

blocking exposure of said stencil to penetration of light through a first surface of said stencil; and exposing said stencil to light for said hardening through a second surface of said stencil opposite said first surface.

10. A stencil of a desired design made by a method comprising in combination the steps of:

providing first and second individually soluble substances being hardenable in admixture;

providing a foraminous stencil blank;

impregnating said foraminous stencil blank with the first substance;

storing the second substance separately from said impregnated stencil blank;

applying the separately stored second substance to the impregnated stencil blank in the form of said design for admixture with the first substance only immediately prior to a desired selective hardening of the admixed first and second substances and exposing the stencil blank to hardening of the admixed first and second substances as to render part of the stencil blank imperforate; and exposing the stencil blank to dissolution of any applied first and second substances outside of said part so as to render the stencil blank perforate outside of said part.

11. A stencil as claimed in claim 10, wherein:

said first and second substances are made hardenable in admixture upon exposure to light; and said stencil blank is exposed to light for said hardening of the admixed first and second substances.

12. A stencil of a desired design made by a method comprising in combination the steps of:

providing first and second individually soluble substances being hardenable in admixture;

providing a foraminous stencil blank;

applying the first substance uniformly to said foraminous stancil blank;

thereafter applying the second substance to selected areas of the stencil blank in the form of said design for admixture with the applied first substance in said areas;

subjecting the stencil blank to hardening of the admixed first and second substances, whereby the stencil blank is rendered imperforate in said areas; and subjecting the stencil blank to dissolution of the first substance outside said selected areas, whereby the stencil blank is rendered perforate outside said areas.

13. In a method of making a stencil from a foraminous stencil blank in which first and second individually soluble substances are hardened in admixture in selected areas of the stencil blank and have a specific appearance upon sufficient hardening in said areas, the improvement comprising in combination the steps of:

providing a foraminous test strip;

providing on a first region of said foraminous test strip a substance having said specific appearance;

impregnating said foraminous stencil blank and a second region of said test strip with said first substance;

thereafter applying the second substance to selected areas of the stencil blank for admixture with the first substance, and applying the second substance also to said second region of the test strip for admixture with the first substance;

subjecting the stencil and the test strip to hardening of the admixed first and second substances until the admixed first and second substances in said test strip display said specific appearance, whereby the stencil is imperforate in said areas; and subjecting the stencil to dissolution of the first substance outside said selected areas, whereby the stencil is perforate outside said areas.

14. A method as claimed in claim 13, wherein:

said first and second substances are made hardenable upon exposure to light; and said stencil and said test strip are exposed to light for said hardening of the admixed first and second substances until the admixed first and second substances in said test strip display said specific appearance.

15. A method as claimed in claim 13 or 14, wherein:

said substance having said specific appearance on said first region of the test strip is provided by impregnating said test strip with said first substance in said first and second regions and applying said second substance to said first region for admixture with said first substance in said first region of the test strip prior to application of said second substance to said selected areas of the stencil blank and to said second region of the test strip; and subjecting said admixed first and second substances in said first region of the test strip to hardening prior to application of said second substance to said selected areas of the stencil blank and to said second region of the test strip until said admixed first and second substances in said first region of the test strip display with said specific appearance.

* * * * *